US 6,571,488 B2

(12) United States Patent
Lin et al.

(10) Patent No.: US 6,571,488 B2
(45) Date of Patent: Jun. 3, 2003

(54) SYSTEM FOR SENSING POSITION OF SPIN DRYER COVER

(75) Inventors: Yu Chih Lin, Hsinchu (TW); Chih Hsin Tsai, Hsinchu (TW); Ming Hua Shih, Hsinchu (TW); Shih Kai Pao, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 10/087,096

(22) Filed: Mar. 1, 2002

(65) Prior Publication Data

US 2002/0166255 A1 Nov. 14, 2002

(30) Foreign Application Priority Data

May 8, 2001 (TW) .......................................... 90110911

(51) Int. Cl.[7] .................................................. F26B 5/08
(52) U.S. Cl. ..................... 34/58; 34/95; 34/90; 34/202; 34/318
(58) Field of Search ................................ 34/58, 90, 95, 34/201, 202, 593, 312, 318, 110, 114; 438/704

(56) References Cited

U.S. PATENT DOCUMENTS

| | | | |
|---|---|---|---|
| 4,626,344 A | * 12/1986 | Fick et al. ........................ 210/90 |
| 4,932,707 A | * 6/1990 | Ekstran ..................... 292/341.17 |
| 5,212,876 A | * 5/1993 | Berit .............................. 34/58 |
| 5,435,075 A | * 7/1995 | Shiraishi et al. ................ 34/58 |
| 5,621,982 A | * 4/1997 | Yamashita et al. ............ 34/203 |
| 5,668,452 A | * 9/1997 | Villarreal et al. ...... 318/568.16 |
| 5,873,177 A | * 2/1999 | Honda et al. ................... 34/58 |
| 6,064,165 A | * 5/2000 | Boisvert et al. ............ 318/465 |
| 6,073,361 A | * 6/2000 | Kramer et al. ................ 34/58 |
| 6,221,781 B1 | * 4/2001 | Siefering et al. ........... 438/704 |
| 6,286,524 B1 | * 9/2001 | Okuchi et al. ............. 134/95.2 |

* cited by examiner

Primary Examiner—Ira S. Lazarus
Assistant Examiner—K. B. Rinehart
(74) Attorney, Agent, or Firm—Townsend and Townsend and Crew LLP

(57) ABSTRACT

Embodiments of the present invention relate to an apparatus for spin drying substrates in a spin dryer tank. A spin dryer cover is movable between a closed position to close an opening of the spin dryer tank and an open position to open the spin dryer tank, and a cylinder is coupled with the spin dryer cover. The cylinder is movable in a first operation to move the spin dryer cover to the open position and movable in a second operation to move the spin dryer cover to the closed position. A system for sensing the position of the spin dryer cover comprises a cylinder sensor configured to sense the first operation and the second operation of the cylinder. A cover sensor is configured to sense the position of the spin dryer cover. A logic circuit is configured to output a cover opening signal indicating that the spin dryer cover is in the open position when the cylinder sensor senses the first operation of the cylinder and the cover sensor senses that the spin dryer cover is in the open position.

20 Claims, 2 Drawing Sheets

SYSTEM FOR SENSING POSITION OF SPIN DRYER COVER

CROSS-REFERENCES TO RELATED APPLICATIONS

This application claims priority from R.O.C. Patent Application No. 090110911, filed May 8, 2001, the entire disclosure of which is incorporated herein by reference.

BACKGROUND OF THE INVENTION

The present invention relates to a system for sensing the position of a spin dryer cover and, more particularly, to a system that prevents collision between a mechanical arm used to retrieve wafers from the spin dryer and the spin dryer cover.

FIG. 1 shows a structural diagram of a conventional spin dryer cover. The spin dryer 1 comprises a cover 11, a spin dryer tank 12, a linkage 13, a cylinder 14, and a cylinder sensor 141. The cylinder 14 may be hydraulically or pneumatically driven, but may also be driven electrically, mechanically, or the like.

To operate the spin dryer 1, the cylinder 14 pulls the linkage 13 back so that the cover 11 closes the spin dryer tank 12 for spin drying. After spin drying, the cylinder 14 pushes the linkage 13 forward so that the cover 11 separates from the spin dryer tank 12 to open up the dryer tank 12. A mechanical arm then moves into the spin dryer tank 12 to retrieve the wafer(s) from the spin dryer tank 12.

FIG. 2 shows a cover sensor circuit of the spin dryer 1. The cover sensor circuit includes a cylinder sensor 141. When the cylinder pushes forward, the cylinder sensor 141 sends a cover opening signal to a control circuit 3.

In the above-described conventional cover sensing system, the mechanical arm may sometimes collide with the cover. In FIG. 1 and FIG. 2, since the cover sensing system senses the position of the cover 11 only by feedback of the cylinder sensor 14, the control circuit 3 still receives the cover opening signal and engages the mechanical arm to remove the wafer even when the linkage 13 or another component malfunctions and the cylinder pushes forward but the cover 11 remains unopened. In that case, the mechanical arm can collide with the cover 11, causing serious damage.

BRIEF SUMMARY OF THE INVENTION

Embodiments of the present invention are directed to a system for sensing the position of a spin dryer cover. The cover opens and closes dependent upon the first operation of the cylinder to open the dryer cover and the second operation of the cylinder to close the dryer cover. The system for sensing the position of a spin dryer cover comprises a cylinder, a cover sensor and a logic circuit. The cylinder sensor senses the first and second operations of the cylinder. The cover sensor detects whether the cover is open or closed. When the first operation of the cylinder has registered with the cylinder sensor and the cover sensor has deduced that the cover has opened, the logic circuit outputs a cover opening signal.

In an apparatus for spin drying substrates in a spin dryer tank, a spin dryer cover is movable between a closed position to close an opening of the spin dryer tank and an open position to open the spin dryer tank, and a cylinder is coupled with the spin dryer cover. The cylinder is movable in a first operation to move the spin dryer cover to the open position and movable in a second operation to move the spin dryer cover to the closed position. One aspect of the present invention is directed to a system for sensing the position of the spin dryer cover comprising a cylinder sensor configured to sense the first operation and the second operation of the cylinder. A cover sensor is configured to sense the position of the spin dryer cover. A logic circuit is configured to output a cover opening signal indicating that the spin dryer cover is in the open position when the cylinder sensor senses the first operation of the cylinder and the cover sensor senses that the spin dryer cover is in the open position.

In some embodiments, the cylinder sensor is configured to sense the first operation when the cylinder is pushed forward. The cylinder sensor is configured to sense the second operation when the cylinder is pulled backward. The cover opening signal is directed to a control circuit which operates a mechanical arm in response to the cover opening signal to enter the spin dryer tank through the opening of the spin dryer tank. The cylinder sensor outputs a first sensing signal to the logic circuit when the cylinder sensor senses the first operation of the cylinder, and the cover sensor outputs a second sensing signal to the logic circuit when the cover sensor senses that the spin dryer cover is in the open position.

In specific embodiments, the logic circuit is a relay comprising a signal terminal configured to receive the second sensing signal from the cover sensor, an input terminal configured to receive the first sensing signal from the cylinder sensor, and an output terminal configured to output the first sensing signal received by the input terminal as the cover opening signal when the control signal terminal receives the second sensing signal. The relay may comprise a solenoid loop that connects with the control signal terminal; and a switch connecting between the input terminal and the output terminal. The system may comprise a bypass switch which is connected to the cylinder sensor and is configured to receive the first sensing signal directly from the cylinder sensor. The bypass switch is movable to a closed position to bypass the logic circuit and output the first sensing signal from the cylinder sensor as the cover opening signal.

Another aspect of the invention relates to an apparatus for spin drying substrates in a spin dryer tank, wherein a spin dryer cover is movable between a closed position to close an opening of the spin dryer tank and an open position to open the spin dryer tank, wherein a cylinder is coupled with the spin dryer cover, the cylinder movable in a first operation to move the spin dryer cover to the open position and movable in a second operation to move the spin dryer cover to the closed position, and wherein a control circuit is operatively coupled with a mechanical arm to control the arm to move into and out of the spin dryer tank through the opening of the spin dryer tank. A system for sensing the position of the spin dryer cover comprises a cylinder sensor configured to sense the first operation and the second operation of the cylinder, and a cover sensor configured to sense the position of the spin dryer cover. A logic circuit is configured to output a cover opening signal to the control circuit indicating that the spin dryer cover is in the open position when the cylinder sensor senses the first operation of the cylinder and the cover sensor senses that the spin dryer cover is in the open position. The control circuit operates the mechanical arm in response to the cover opening signal to enter the spin dryer tank through the opening of the spin dryer tank.

Another aspect of the present invention relates to an apparatus for spin drying substrates in a spin dryer tank, wherein a spin dryer cover is movable between a closed position to close an opening of the spin dryer tank and an open position to open the spin dryer tank, and wherein a cylinder is coupled with the spin dryer cover, the cylinder movable in a first operation to move the spin dryer cover to the open position and movable in a second operation to move the spin dryer cover to the closed position. A system for sensing the position of the spin dryer cover comprises a cylinder sensor configured to sense the first operation and the second operation of the cylinder, and a cover sensor configured to sense the position of the spin dryer cover. A logic circuit is configured to output a cover opening signal indicating that the spin dryer cover is in the open position when the cylinder sensor senses the first operation of the cylinder and the cover sensor senses that the spin dryer cover is in the open position. A bypass switch is connected to the cylinder sensor and is configured to receive the first sensing signal directly from the cylinder sensor. The bypass switch is movable to a closed position to bypass the logic circuit and output the first sensing signal from the cylinder sensor as the cover opening signal.

DETAILED DESCRIPTION OF THE INVENTION

Figure 1:
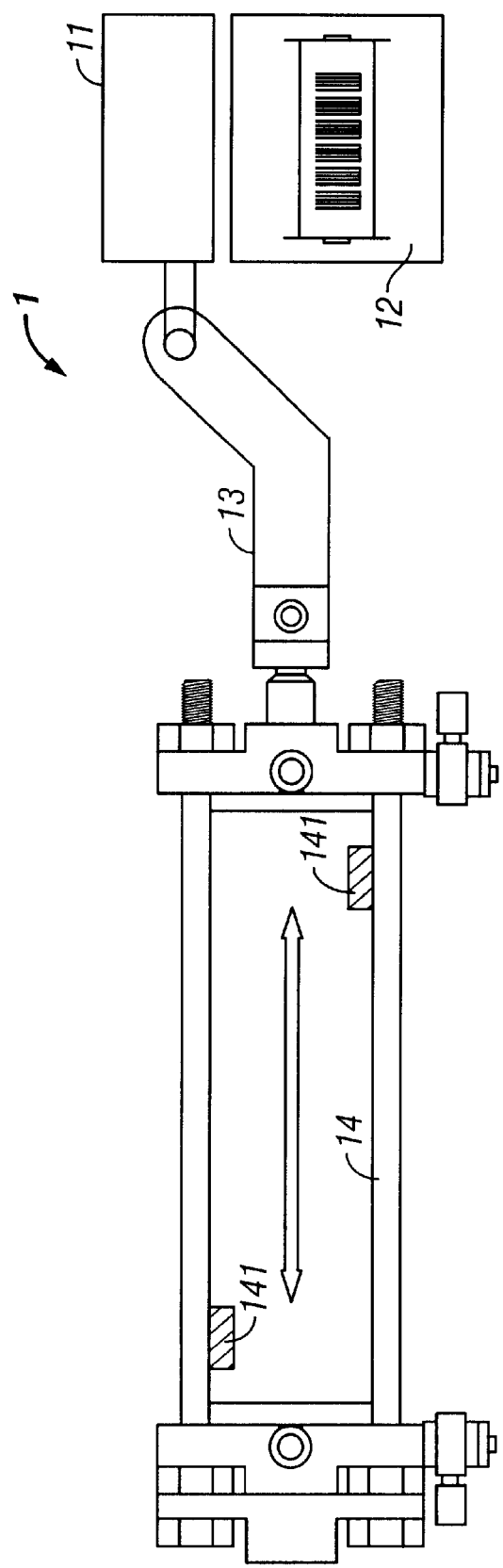
FIG. 1 is a diagram illustrating the mechanical structure of a conventional spin dryer cover.
Figure 2:
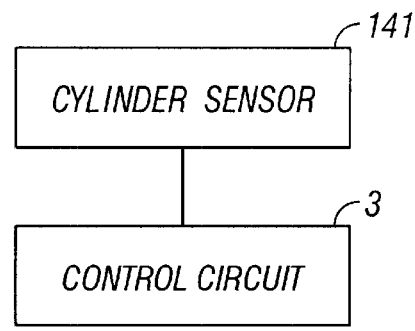
FIG. 2 is a block diagram illustrating a cover sensor circuit in the conventional spin dryer of FIG. 1.
Figure 3:
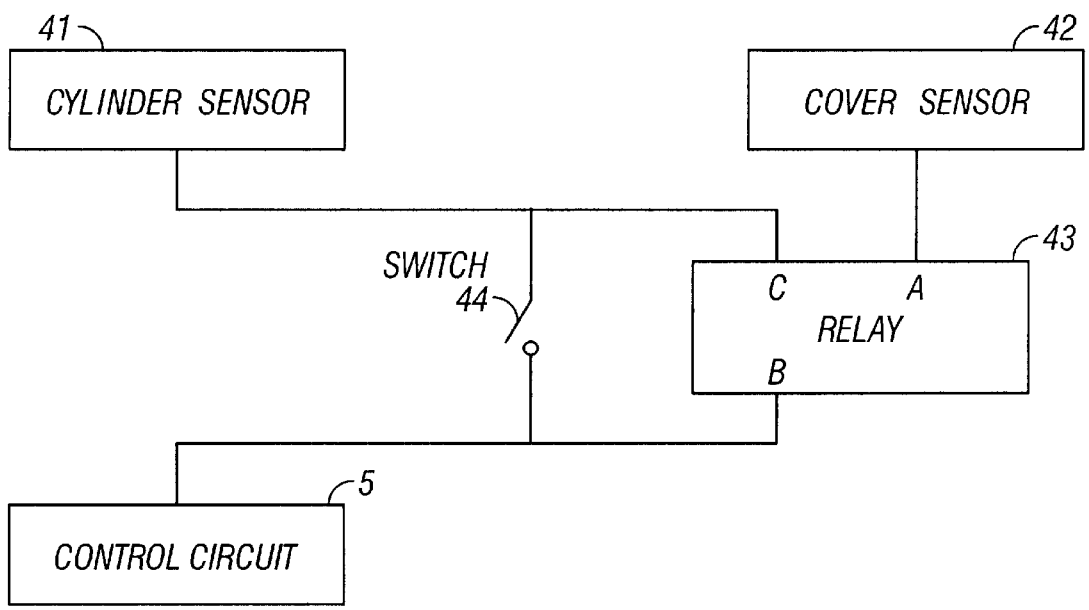
FIG. 3 is a schematic diagram illustrating a system for sensing the position of a spin dryer cover according to an embodiment of the present invention.

FIG. 3 shows the system for sensing the position of a spin dryer cover of the embodiment of the present invention has a cylinder sensor 41, a cover sensor 42, a relay 43, and a switch 44.

The cover sensor 42 situated near the cover 11 senses the cover's position. When the cover sensor 42 has sensed the cover 11 open, a signal is sent to a control signal terminal A of relay 43.

In the relay 43, the control signal terminal A couples to the cover sensor 42, an output terminal B couples to a control circuit 5, and an input terminal C couples to the cylinder sensor 41. The cylinder sensor 41 may output a cylinder sensor signal to the input terminal C of the relay 43 when the cylinder sensor 41 has sensed the cylinder 14 is in the forward position. Furthermore, the cover sensor 42 may output a cover sensor signal to the control signal terminal A of the relay 43 when the cover sensor 42 detects an open cover 11. The relay 43 may close input terminal C and output terminal B after receiving the cover sensor signal, or may keep them open.

The output of the cylinder sensor 41 may be delivered to the control circuit 5 directly when the bypass switch 44 is closed, and delivered to the relay 43 when the switch 44 is open.

The operation of the above system is described as follows.

First, during normal operation, the switch 44 is set to an open position. When the cover 11 is closed, since the cylinder 14 is in the retracted position, the cylinder sensor 41 will not output a cylinder sensor signal and the cover sensor 42 also will not output the cover sensor signal, so that the relay 43 will keep the input terminal C and the output terminal B open. Therefore the control circuit 5 will not receive any cover opening signal, and will not initialize the mechanical arm. After spin drying, the cylinder 14 starts to open the cover 11, since the cylinder 14 migrates to the forward position, creating the output of a cylinder sensor signal to the input terminal C. At this time, if the forward operation of the cylinder 14 correctly opens the cover 11 by way of the linkage 13, the cover sensor 42 will output the cover sensor signal to the control signal terminal A of the relay 43, and the relay 43 will close the switch 431 between the input terminal C and the output terminal B. Consequently, the relay 43 will output the cylinder sensor signal received from the input terminal C to the control circuit 5 through the output terminal B as a cover opening signal. At this time, if the forward operation of the cylinder 14 has not opened the cover 11 effectively, the cover sensor 42 will not output the cover sensor signal since the cover sensor 42 has not yet detected the cover's open position. Therefore, the input terminal C and the output terminal B of relay 43 remain open, and the cylinder sensor signal will not reach the control circuit 5 through the relay 43 as a cover opening signal.

When the cover sensor 42 cannot operate properly, the cylinder sensor 41 outputs to the control circuit 5 directly, bypassing the relay 43 by closing the switch 44, ignoring the cover sensor 42 and utilizing the conventional detection method.

Figure 4:
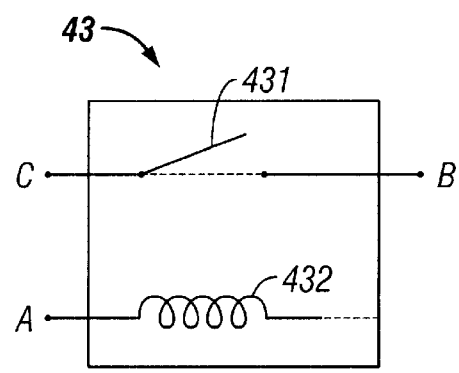
FIG. 4 is a schematic diagram illustrating a relay in the system of FIG. 3 according to an embodiment of the present invention.

As shown in FIG. 4, the relay 43 is composed of a switch 431 and a solenoid loop 432. The switch 431 and the solenoid loop 432 connect the output terminal B and the input terminal C, respectively, with the control signal terminal A. In the initial state, the switch 431 remains open, and the input terminal C and the output terminal B are unconnected. When the control signal terminal A receives the cover sensor signal, the solenoid loop 432 may generate magnetic induction so that the switch 431 is directed to close. Thus, the input terminal C and the output terminal B are connected. After the cover sensor signal has been disabled, the switch 431 returns to the initial state.

In the exemplary embodiment of the invention, the cylinder sensor senses the first and second operations of the cylinder. The cover sensor detects whether the cover is open or closed. When the first operation of the cylinder has registered with the cylinder sensor and the cover sensor has deduced that the cover has opened, the logic circuit outputs a cover opening signal. This minimizes the chances that the mechanical arm will collide with the cover due to malfunctions.

The above-described arrangements of apparatus and methods are merely illustrative of applications of the principles of this invention and many other embodiments and modifications may be made without departing from the spirit and scope of the invention as defined in the claims. For instance, different circuits may be used to generate the cover opening signal based on the signals from the cylinder sensor and the cover sensor. The scope of the invention should, therefore, be determined not with reference to the above description, but instead should be determined with reference to the appended claims along with their full scope of equivalents.

What is claimed is:

1. In an apparatus for spin drying substrates in a spin dryer tank, wherein a spin dryer cover is movable between a closed position to close an opening of the spin dryer tank and an open position to open the spin dryer tank, and wherein a cylinder is coupled with the spin dryer cover, the cylinder movable in a first operation to move the spin dryer cover to the open position and movable in a second operation to move the spin dryer cover to the closed position, a system for sensing the position of the spin dryer cover comprising:

a cylinder sensor configured to sense the first operation and the second operation of the cylinder;

a cover sensor configured to sense the position of the spin dryer cover; and a logic circuit configured to output a cover opening signal indicating that the spin dryer cover is in the open position when the cylinder sensor senses the first operation of the cylinder and the cover sensor senses that the spin dryer cover is in the open position.

2. The system of claim 1 wherein the cylinder sensor is configured to sense the first operation when the cylinder is pushed forward.

3. The system of claim 1 wherein the cylinder sensor is configured to sense the second operation when the cylinder is pulled backward.

4. The system of claim 1 wherein the cover opening signal is directed to a control circuit which operates a mechanical arm in response to the cover opening signal to enter the spin dryer tank through the opening of the spin dryer tank.

5. The system of claim 1 wherein the cylinder sensor outputs a first sensing signal to the logic circuit when the cylinder sensor senses the first operation of the cylinder, and wherein the cover sensor outputs a second sensing signal to the logic circuit when the cover sensor senses that the spin dryer cover is in the open position.

6. The system of claim 5 wherein the logic circuit is a relay comprising a signal terminal configured to receive the second sensing signal from the cover sensor, an input terminal configured to receive the first sensing signal from the cylinder sensor, and an output terminal configured to output the first sensing signal received by the input terminal as the cover opening signal when the control signal terminal receives the second sensing signal.

7. The system of claim 6 wherein the relay comprises a solenoid loop that connects with the control signal terminal; and a switch connecting between the input terminal and the output terminal.

8. The system of claim 5 further comprising a bypass switch which is connected to the cylinder sensor and is configured to receive the first sensing signal directly from the cylinder sensor, the bypass switch being movable to a closed position to bypass the logic circuit and output the first sensing signal from the cylinder sensor as the cover opening signal.

9. In an apparatus for spin drying substrates in a spin dryer tank, wherein a spin dryer cover is movable between a closed position to close an opening of the spin dryer tank and an open position to open the spin dryer tank, wherein a cylinder is coupled with the spin dryer cover, the cylinder movable in a first operation to move the spin dryer cover to the open position and movable in a second operation to move the spin dryer cover to the closed position, and wherein a control circuit is operatively coupled with a mechanical arm to control the arm to move into and out of the spin dryer tank through the opening of the spin dryer tank, a system for sensing the position of the spin dryer cover comprising:

a cylinder sensor configured to sense the first operation and the second operation of the cylinder;

a cover sensor configured to sense the position of the spin dryer cover; and a logic circuit configured to output a cover opening signal to the control circuit indicating that the spin dryer cover is in the open position when the cylinder sensor senses the first operation of the cylinder and the cover sensor senses that the spin dryer cover is in the open position, the control circuit operating the mechanical arm in response to the cover opening signal to enter the spin dryer tank through the opening of the spin dryer tank.

10. The system of claim 9 wherein the cylinder sensor is configured to sense the first operation when the cylinder is pushed forward.

11. The system of claim 9 wherein the cylinder sensor is configured to sense the second operation when the cylinder is pulled backward.

12. The system of claim 9 wherein the cylinder sensor outputs a first sensing signal to the logic circuit when the cylinder sensor senses the first operation of the cylinder, and wherein the cover sensor outputs a second sensing signal to the logic circuit when the cover sensor senses that the spin dryer cover is in the open position.

13. The system of claim 12 wherein the logic circuit is a relay comprising a signal terminal configured to receive the second sensing signal from the cover sensor, an input terminal configured to receive the first sensing signal from the cylinder sensor, and an output terminal configured to output the first sensing signal received by the input terminal as the cover opening signal when the control signal terminal receives the second sensing signal.

14. The system of claim 13 wherein the relay comprises a solenoid loop that connects with the control signal terminal; and a switch connecting between the input terminal and the output terminal.

15. The system of claim 12 further comprising a bypass switch which is connected to the cylinder sensor and is configured to receive the first sensing signal directly from the cylinder sensor, the bypass switch being movable to a closed position to bypass the logic circuit and output the first sensing signal from the cylinder sensor as the cover opening signal.

16. In an apparatus for spin drying substrates in a spin dryer tank, wherein a spin dryer cover is movable between a closed position to close an opening of the spin dryer tank and an open position to open the spin dryer tank, and wherein a cylinder is coupled with the spin dryer cover, the cylinder movable in a first operation to move the spin dryer cover to the open position and movable in a second operation to move the spin dryer cover to the closed position, a system for sensing the position of the spin dryer cover comprising:

a cylinder sensor configured to sense the first operation and the second operation of the cylinder;

a cover sensor configured to sense the position of the spin dryer cover;

a logic circuit configured to output a cover opening signal indicating that the spin dryer cover is in the open position when the cylinder sensor senses the first operation of the cylinder and the cover sensor senses that the spin dryer cover is in the open position; and a bypass switch which is connected to the cylinder sensor and is configured to receive the first sensing signal directly from the cylinder sensor, the bypass switch being movable to a closed position to bypass the logic circuit and output the first sensing signal from the cylinder sensor as the cover opening signal.

17. The system of claim 16 wherein the cover opening signal is directed to a control circuit which operates a mechanical arm in response to the cover opening signal to enter the spin dryer tank through the opening of the spin dryer tank.

18. The system of claim 16 wherein the cylinder sensor outputs a first sensing signal to the logic circuit when the cylinder sensor senses the first operation of the cylinder, and wherein the cover sensor outputs a second sensing signal to the logic circuit when the cover sensor senses that the spin dryer cover is in the open position.

19. The system of claim 18 wherein the logic circuit is a relay comprising a signal terminal configured to receive the second sensing signal from the cover sensor, an input terminal configured to receive the first sensing signal from the cylinder sensor, and an output terminal configured to output the first sensing signal received by the input terminal as the cover opening signal when the control signal terminal receives the second sensing signal.

20. The system of claim 19 wherein the relay comprises a solenoid loop that connects with the control signal terminal; and a switch connecting between the input terminal and the output terminal.

\* \* \* \* \*